US007368916B2

(12) United States Patent
Waymouth et al.

(10) Patent No.: US 7,368,916 B2
(45) Date of Patent: May 6, 2008

(54) APPARATUS AND METHODS FOR MAKING CAPACITIVE MEASUREMENTS OF CATHODE FALL IN FLUORESCENT LAMPS

(75) Inventors: John Francis Waymouth, Marblehead, MA (US); Robert Thomas Nachtrieb, Lansdale, PA (US); Farheen Khan, Coopersburg, PA (US); Mark Alan Hartfield, Saint Joseph, MI (US); Mark Stephen Taipale, Harleysville, PA (US); Renzo Corrado DeMeo, Huntington, NY (US); Russell Lawrence MacAdam, Coopersburg, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 78 days.

(21) Appl. No.: 11/335,326

(22) Filed: Jan. 19, 2006

(65) Prior Publication Data

US 2006/0122797 A1 Jun. 8, 2006

Related U.S. Application Data

(62) Division of application No. 10/818,667, filed on Apr. 6, 2004, now Pat. No. 7,002,301.

(60) Provisional application No. 60/511,291, filed on Oct. 15, 2003, provisional application No. 60/511,570, filed on Oct. 15, 2003.

(51) Int. Cl.
*G01R 31/00* (2006.01)

(52) U.S. Cl. ....................... 324/405; 324/409; 315/135

(58) Field of Classification Search ........ 324/405–410; 315/135
See application file for complete search history.

(56) References Cited

U.S. PATENT DOCUMENTS

| | | | | |
|---|---|---|---|---|
| 2,794,946 | A | 6/1957 | Larsen | 322/2 R |
| 5,055,743 | A | 10/1991 | Elstrand | 315/111.51 |
| 5,808,422 | A | 9/1998 | Venkitasubrahmanian et al. | 315/225 |
| 6,285,138 | B1 * | 9/2001 | Kataoka et al. | 315/291 |
| 6,294,883 | B1 | 9/2001 | Weindorf | 315/291 |
| 6,339,299 | B1 | 1/2002 | Wu et al. | 315/244 |
| 2003/0057814 | A1 | 3/2003 | Garner | 313/274 |
| 2003/0160574 | A1 | 8/2003 | Gray | 315/291 |
| 2003/0168994 | A1 | 9/2003 | Grabner et al. | 315/224 |
| 2005/0088102 | A1 | 4/2005 | Ferguson et al. | 315/149 |
| 2005/0093462 | A1 | 5/2005 | Waymouth et al. | 315/149 |
| 2005/0134184 | A1 | 6/2005 | Abiko | 315/94 |

OTHER PUBLICATIONS

Hammer, E.E., "Cathode Fall Voltage Relationship with Fluorescent Lamps", *IESNA Conference*, Miami Beach FL, 1994, (Published Version)- Journal of the Illuminating Engineering Society, Winter 1995, 116-122.

(Continued)

*Primary Examiner*—Vincent Q. Nguyen
(74) *Attorney, Agent, or Firm*—Woodcock Washburn LLP

(57) ABSTRACT

Apparatus and methods for measuring cathode fall in fluorescent lamps are disclosed. Together with measurements of cathode temperature, such measurements of cathode fall may inform a determination of cathode heater voltage as a function of discharge current (i.e., a cathode-heating-profile) that avoids both sputtering and excess-evaporation.

15 Claims, 15 Drawing Sheets

OTHER PUBLICATIONS

Hammer, E.E., "Comparative Starting Characteristics in Typical F40 Systems", *IESNA Conference* Minneapolis MN, 1988, (Published version)- Journal of the Illuminating Engineering Society, Winter 1989, 63-69.

Ligthart, F.S. et al., "Additional Electrode Heating during Dimming of HF Operated Fluorescent Lamps" 5th *International Symposium on Science and Technology of Light Sources*, (LS-5), 1989, Paper 17L, York England.

Waymouth, J.F., "Electric Discharge Lamps", 1971, *Mit Press*, Chapter IV and Appendix B, 69-112.

Schenkelaars, H.J.W. et al., "Zero Field Thermionic Emission in HF Operated Fluorescent Lamps", 5th *International Symposium on Science and Technology of Light Sources*, (LS-5), Sep. 10-14, 1989, York England, 1 page.

* cited by examiner

APPARATUS AND METHODS FOR MAKING CAPACITIVE MEASUREMENTS OF CATHODE FALL IN FLUORESCENT LAMPS

CROSS-REFERENCE TO RELATED APPLICATIONS

This application is a division of U.S. patent application Ser. No. 10/818,667, filed Apr. 6, 2004, now U.S. Pat. No. 7,002,301, which claims benefit under 35 U.S.C. § 119(e) of provisional U.S. patent application No. 60/511,291, filed Oct. 15, 2003, and of provisional U.S. patent application No. 60/511,570, filed Oct. 15, 2003.

The subject matter disclosed and claimed herein is related to the subject matter disclosed and claimed in U.S. patent application Ser. No. 10/818,664, now U.S. patent No. 7,116, 055, filed Apr. 6, 2004.

The disclosure of each of the above-referenced patent applications is incorporated herein by reference in its entirety.

FIELD OF THE INVENTION

Generally, the invention relates to measuring cathode fall in fluorescent lamps. More particularly, the invention relates to apparatus and methods for making capacitive measurements of cathode fall in fluorescent lamps.

BACKGROUND OF THE INVENTION

Typical fluorescent lamps contain electrodes that, when operated at the lamp's rated discharge current, are heated to cause thermionic emission of electrons. Such lamps typically contain two electrodes. Each electrode serves as an anode during a first half-cycle of the alternating current (AC) provided to the electrodes, while the other electrode serves as cathode. During the subsequent half-cycle, the electrodes swap roles. Thus, each electrode serves as cathode and anode on alternating half-cycles.

Such fluorescent lamps may be dimmed by reducing the current supplied to the electrodes. Reducing the current, however, also reduces the electrode temperature. If the cathode, for example, is not sufficiently hot, it may not have sufficient thermionic emission to maintain the discharge as a thermionic arc. Rather, it may be forced to operate in a "cold-cathode" (i.e., high cathode-fall, high sputtering) mode. The resulting sputtering damage may cause the cathode, and thus the lamp, to fail within a few hours. Less destructive, but equally fatal in the long run, is the fact that a not-quite-hot-enough cathode will have a higher-than-normal cathode fall even though the cathode continues to operate in the thermionic-arc mode. If the cathode fall exceeds the so-called "disintegration voltage" or "sputter voltage," incoming mercury ions bombard the cathode with sufficient energy to dislodge (i.e., "sputter") surface atoms, bringing about increased rate-of-loss of cathode coating and short life.

In order to avoid these effects in fluorescent lamp dimming, an auxiliary electrode heating current may be supplied to the electrode filament to heat the filament sufficiently, by Ohmic heating, to cause thermionic emission. At low dimming currents with minimal heating of the cathode from the discharge current, the auxiliary supply may be the only heat source available to maintain cathode temperature. The auxiliary supply maybe a low voltage, typically <6 volts, AC supply connected to the two ends of the filament structure holding the emissive coating. Resistive heating in the filament then furnishes the necessary heating power to maintain the cathode temperature at a desired level. The heating level and corresponding cathode temperature may be controlled by adjustments in the voltage or current furnished by the auxiliary heating power supply.

Obviously, the lower the dimming level at which the lamp is operated, the higher the auxiliary electrode heating current that will be required. If the voltage of the auxiliary heat supply is too low, then the cathode is too cold, the thermionic-arc cathode fall is too high, sputtering occurs with accelerated loss of cathode coating, and short lamp life results. Accordingly, it would be desirable to define a lower limit for the auxiliary electrode heating current in order to keep the lamp life within a reasonable range. On the other hand, if the voltage of the auxiliary heat supply is too high, the cathode temperature is too high, and excessive evaporation of cathode coating leads to short lamp life, even though the cathode fall is maintained well below the disintegration voltage. Steering a course between the Scylla and Charybdis perils represented by sputtering or excess evaporation is therefore desirable in selecting an appropriate cathode-heating-voltage profile as a function of discharge current. Such considerations may be particularly useful in the design of dimming ballasts.

By techniques known in the art, cathode temperature may be measured with an optical pyrometer, provided special lamps with phosphor wiped away from the ends are used to render the cathode visible. Alternatively, average cathode temperature may be determined in lamps without wiped ends by measuring the ratio of hot-to-cold-resistance of the cathode tungsten coil.

A technique is known for determining heater current as a function of discharge current in one particular lamp type of one particular wattage (see F. S. Ligthart, H. Ter Heyden, and L. Kastelein (Paper 17L, 5th International Symposium on Science and Technology of Light Sources, York, England 1989). This technique, however, involves life-testing a number of lamps at various values of heater current and discharge current for a long period of time. Examination of the resulting discolorations on the ends of the lamps could discriminate between sputtering, which may lead to so-called "end band" discoloration, excess evaporation, which may lead to so-called "cathode spotting" discoloration, and satisfactory heater voltage, which exhibits little or no discoloration.

FIG. 1 provides typical sputter and vaporization curves obtained using this technique. Heater-current versus lamp-current points where excessive evaporation was found are identified with a □; points where excessive sputtering was found are identified with a o; points where neither excessive evaporation nor excessive sputtering were found are marked with an x. Points lying between the two curves may be considered acceptable. Points lying below the sputter curve may lead to sputtering. Points lying above the vaporization curve may lead to excessive evaporation.

Though such a technique may provide information that is useful in determining the correct heater-current profile versus dimming current, it is far too cumbersome for an electronic ballast manufacturer to employ efficiently. To provide comprehensive results, it would have to be repeated for every different wattage of every different lamp type. In addition, cathode designs employed by different lamp manufacturers for the same lamp type are different, requiring testing of a number of different versions of the same lamp type.

FIG. 2 provides a plot of cathode fall as a function of phase angle for a typical fluorescent lamp. Specifically, FIG.

2 shows cathode fall as a function of phase angle in a typical T12 Rapid Start fluorescent lamp operating at rated current and heater voltage. Measurements of cathode fall were made using special lamps equipped with so-called "Langmuir Probes" (see John F. Waymouth, "Electric Discharge Lamps," MIT Press 1971, Chapter IV and Appendix B). It should be understood that, as the data provided in FIG. 2 is on an absolute, rather than relative, basis, the plot of FIG. 2 provides a standard against which other methods for measuring cathode fall may be compared.

FIG. 3A provides a plot of cathode and anode falls for a typical fluorescent lamp. FIG. 3B provides a plot of arc current supplied to produce the cathode and anode falls plotted in FIG. 3A. Cathode fall in 60-Hz AC operated fluorescent lamps was measured via a method, attributable to Hammer, et al., wherein a capacitive probe, which may be a foil sheet, for example, is wrapped around a portion of the lamp that contains the electrode (see, for example, E. E. Hammer, "Comparative Starting Characteristics in Typical F40 Systems", Preprint, IESNA Conference Minneapolis Minn. 1988, and its published version, JIES Winter 1989, p 64; and E. E. Hammer, "Cathode Fall Relationships in Fluorescent Lamps", Preprint #69, IESNA Conference, Miami Beach Fla., 1994, and its published version, JIES, Winter 1995, p 116). The probe picks up fluctuations of plasma potential in proximity to the electrode, and presents them to an oscilloscope for detection. As the negative glow in front of the cathode is approximately an equipotential blob of high-density plasma at a potential (positive relative to the cathode) that is equal to the cathode fall, fluctuations of plasma potential on the cathode half cycle may be interpreted as the signature of fluctuations of cathode fall during the half cycle.

Positive swings of potential are attributed to cathode fall (negative glow plasma that is positive with respect to the electrode) while negative swings are identified with anode fall (negative glow plasma that is negative with respect to the electrode). When allowance is made for the difference in lamp-current waveform, the shape of the curve agrees well with that shown in FIG. 2. The jagged fluctuations seen in FIG. 3A on the anode half cycle are so-called "anode oscillations."

Because capacitive coupling causes a loss of DC reference, the Hammer method provides no information as to the value of the zero of potential. Thus, although the Hammer method may provide qualitative information about the shape of the cathode and anode fall waveforms, and about the peak-to-peak difference between peak cathode fall and peak anode fall, it does not provide the magnitude of either. Further, fluctuating potential signals from the cathode heater voltage may be picked up. Also, a very high input impedance is required for the measuring oscilloscope, which precludes the use of the Hammer method on small-diameter, compact fluorescent lamps. Additionally, capacitance between the signal lead and the shielded cable shunts the signal to ground, which reduces the apparent amplitude of the cathode fall variation. It would be desirable, therefore, if apparatus and methods were available for making capacitive measurements of the magnitude of cathode fall in fluorescent lamps, without the limitations exhibited by the Hammer method.

SUMMARY OF THE INVENTION

The invention provides apparatus and methods for measuring cathode fall in fluorescent lamps. Together with measurements of cathode temperature, such measurements of cathode fall may inform a determination of cathode heater voltage as a function of discharge current (i.e., a cathode-heating-profile) that avoids both sputtering and excess-evaporation.

The peak of anode fall oscillation marks the anode sheath potential exceeding the ionization potential of mercury, which results in incoming electrons having sufficient energy to ionize mercury atoms in the anode sheath. The added ionization collapses the sheath voltage to nearly zero. Thus, the potential of the peak of the anode fall on the capacitive waveform can be unambiguously determined as −10.4 volts, establishing an absolute voltage reference. Thus, the absolute magnitude of cathode fall may be determined.

Fluctuating potential signals from the cathode heater voltage may be eliminated through the use of direct-current cathode-heater voltages. However, this introduces a minor uncertainty, because there is a DC voltage gradient along the cathode coil. If the cathode-emission spot and the anode-collection spot are not at the same point along the filament, then there is an uncertain DC offset between anode and cathode half cycles in the capacitive waveform. This may be corrected by inserting a pair of diodes in the filament circuit to force cathode current emission to occur at the negative end of the filament, and anode current collection to occur at the positive end of the filament. Thus, the offset between anode and cathode half cycles becomes simply the heater voltage.

A negative-feedback operational amplifier may be introduced to provide high input impedance and low output impedance to the oscilloscope so that the principles of the invention may be applied to small-diameter, compact fluorescent lamps. Through proper grounding, the signal lead and shielded cable may be held at the same potential, so that no current flows between them despite the capacitance between them. Thus, the capacitance does not shunt the signal to ground, and the apparent amplitude of the cathode fall variation is unaffected.

According to an aspect of the invention, cathode fall may be measured in linear fluorescent lamps operated on 60-Hz AC. The cathode-heating-profile obtained for 60 Hz AC may then be used as a guide in the design of electronic dimming ballasts operating at higher AC frequencies. The inventive techniques may also be used in the design of cathodes for newly-developed lamps, to obtain optimum designs without need for extensive lamp life-testing.

BRIEF DESCRIPTION OF THE DRAWINGS

In the drawings, wherein like numerals indicate like elements.

DETAILED DESCRIPTION OF ILLUSTRATIVE EMBODIMENTS

Figure 4:
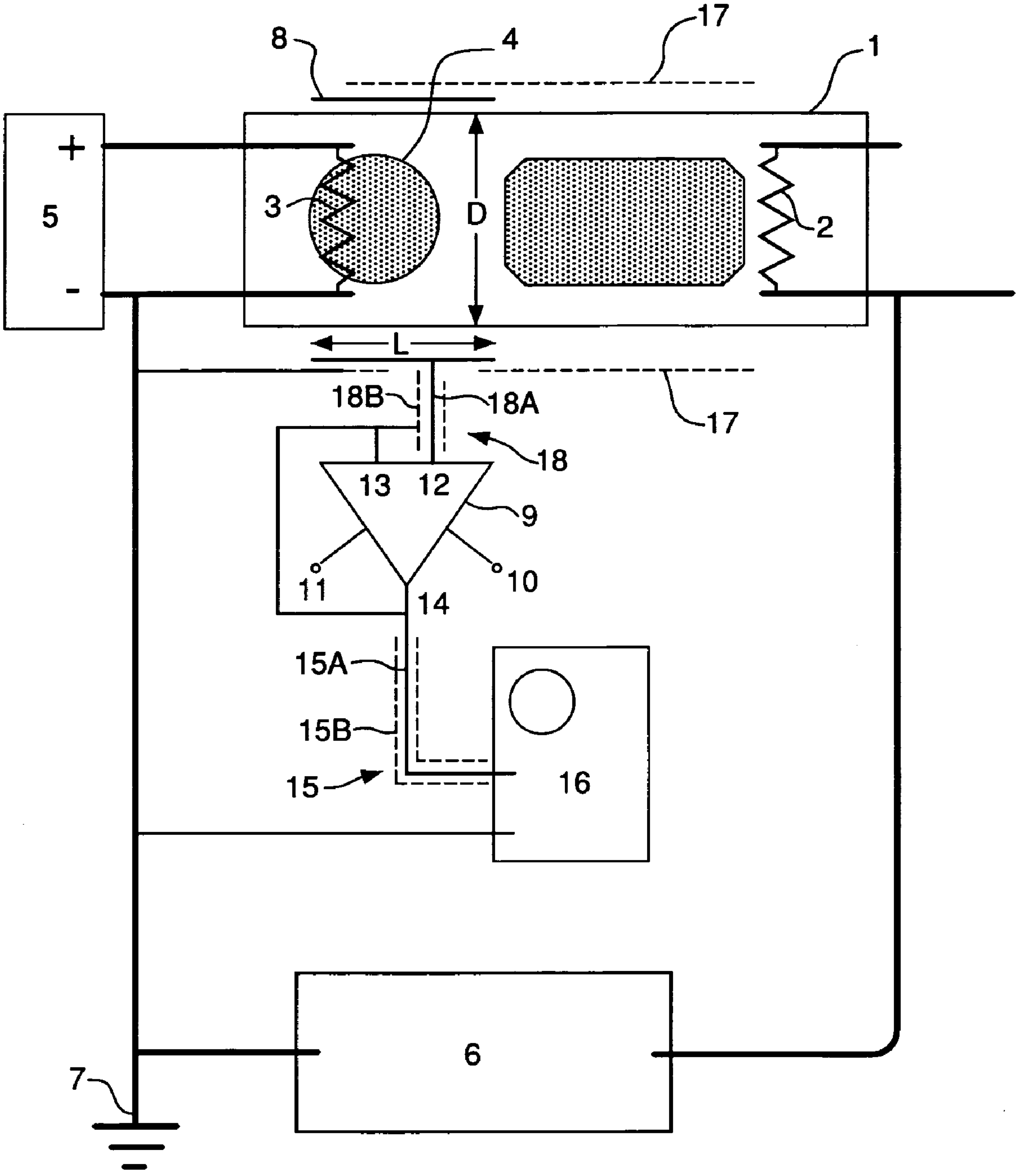
FIG. 4 is a block diagram of an example embodiment of apparatus according to the invention for measuring cathode fall.

FIG. 4 is a block diagram of an example embodiment of apparatus according to the invention for making capacitive measurements of cathode fall in a fluorescent lamp 1, which contains a pair of electrodes 2 and 3. A direct current (DC) power supply 5 may be electrically coupled to one of the electrodes (e.g., electrode 3) to supply a cathode heater current to the electrode 3. An alternating current (AC) current-limiting, or "dimming," ballast 6 may be electrically coupled to the electrodes 2, 3 to supply a discharge current between the electrodes 2, 3. In operation, a negative glow plasma 4 envelopes the cathode 3, at a plasma potential equal to the cathode fall. It should be understood that the plasma potential is positive with respect to the cathode 3.

As shown, a closely-fitting, conductive sleeve 8 may surround a portion of the lamp 1 that contains the electrode 3. The sleeve 8, which may be a foil sheet, for example, having a length L that is approximately the same as the diameter D of the lamp 1, forms one plate of a capacitor. The negative glow plasma 4 forms a second plate of the capacitor. A grounded metal sleeve 17 may surround the lamp 1 to shield the detection circuit from interference from any stray, high-voltage signals that may be produced along the lamp 1.

An operational amplifier 9, which may be a "Burr-Brown" Model OPA121KP, for example, may be electrically coupled to the sleeve 8 to measure the potential of the sleeve 8. The operational amplifier may be configured in a differential-amplifier, negative-feedback manner, as shown. In an example embodiment, the operational amplifier 9 may be configured to have an effective input impedance that is greater than about $10^{13}$ ohms, and a DC offset of less than about 5 picoamperes. The operational amplifier 9 may include a connection 10 to a positive DC power supply (not shown), and a connection 11 to a negative DC power supply (not shown). Thus, if the power supplies are ±16 volts, for example, the operational amplifier 9 can accept a 32-volt range of input potentials before reaching a limiting saturation.

The operational amplifier 9 may also include a first input, or "live," terminal 12, a second input, or "reference," terminal 13, and an output terminal 14. The reference terminal 13 may be connected directly to the output terminal 14 of the operational amplifier 9. The live terminal 12 may be electrically coupled to the sleeve 8 via an electrically conductive lead 18A. The lead 18A may be provided as part of a shielded cable 18 comprising the lead 18A shielded by an electrical shield 18B. The shield 18B of lead 18 may be electrically coupled to the reference terminal 13 and, thus, to the output terminal 14 of the operational amplifier 9.

The output terminal 14 of the operational amplifier 9 may be electrically coupled to an input terminal of an oscilloscope 16 via an electrically conductive lead 15A. The lead 15A may be provided as part of a shielded cable 15 comprising the lead 15A shielded by an electrical shield 15B. The shield 15B may be connected to ground 7. It should be understood that the impedance presented to the output terminal 14 of the operational amplifier 9 is the input impedance of the oscilloscope 16 (which may, for example, be set at 50 ohms, directly coupled). Because of the relatively low input impedance of the oscilloscope 16, a relatively long shielded cable 15, with significant capacitance to ground, can be tolerated without degradation of the signal waveform received from the sleeve 8.

The output terminal 14 may be driven by the operational amplifier 9 at a potential that is essentially identical to the potential applied to the input terminal 12, i.e., the potential of the sleeve 8. Thus, the internal lead 18A and external shield 18B of the shielded cable 18 may be set at the same potential so that no current flows between them despite the capacitance between the lead 18A and shield 18B. Consequently, the connection between the sleeve 8 and the amplifier input terminal 12 may be effectively protected from the influence of extraneous signals, without any appreciable loss of the signal from the sleeve 8 that may be due to capacitive leakage to the shield 18B.

The use of the operational amplifier 9 thus improves upon the method of Hammer in at least two significant ways. First, the relatively high input impedance at the input terminal 12 makes possible measurements on lamps of the smallest diameters currently available (i.e., T2). For T12 lamps, for example, the maximum capacitance between the sleeve 8 and the negative glow plasma 4 is known to be about 12 pf, with a 60-Hz impedance of $2.2\times10^8$ ohms. For T2 lamps, the corresponding values would be 0.33 pf and $7.9\times10^9$ ohms. An effective input impedance of $>10^{13}$ ohms for the operational amplifier 9 is many times greater than these values, which ensures no "loading" of the capacitor formed by the sleeve 8 and plasma 4 by the measuring circuit.

Also, the low output impedance of the operational amplifier 9 permits the use of a long, shielded cable to transfer the potential signal to the oscilloscope 16 without picking up unwanted, stray signals, and without loss of signal by shunting through the shield capacitance to ground. Further, the connection of the shield 18B of the cable 18 to the output terminal 14 of the operational amplifier 9 prevents loss of input signal by capacitive leakage to ground, while protecting the input from extraneous signals. The use of a DC power supply 5 to heat the electrode 3 eliminates the pickup of extraneous alternating current signals.

It should be understood that the zero of potential of the waveform observed at the oscilloscope may be determined from the fact that the peak anode fall, at the maximum of its oscillatory potential, is equal to the ionization potential of mercury. Also, at the peak anode fall, the plasma 4 is at 10.4 volts negative with respect to the anode (see Waymouth, *Electric Discharge Lamps*, p. 110, MIT Press, October 1971, ISBN 0-262-23048-8). Thus, the absolute potential of one point on the oscilloscope waveform may be identified without ambiguity. As the fluctuations of potential seen in the oscilloscope waveform faithfully reflect the fluctuations of the negative glow potential, the absolute potentials of all other points on the trace may now be uniquely determined.

It should also be understood that the use of a DC power supply for cathode heating imposes a DC potential gradient along the coiled cathode filament. If the anode current is not collected at the same point along the filament as the location of the principal cathode emission, there will be a DC potential difference between the zero of potential for anode fall measurement and the zero of potential for cathode fall measurement. Because heater voltages are of several volts magnitude, there could easily be a non-measurable difference of a volt or two between these zeros of potential.

Figure 5:
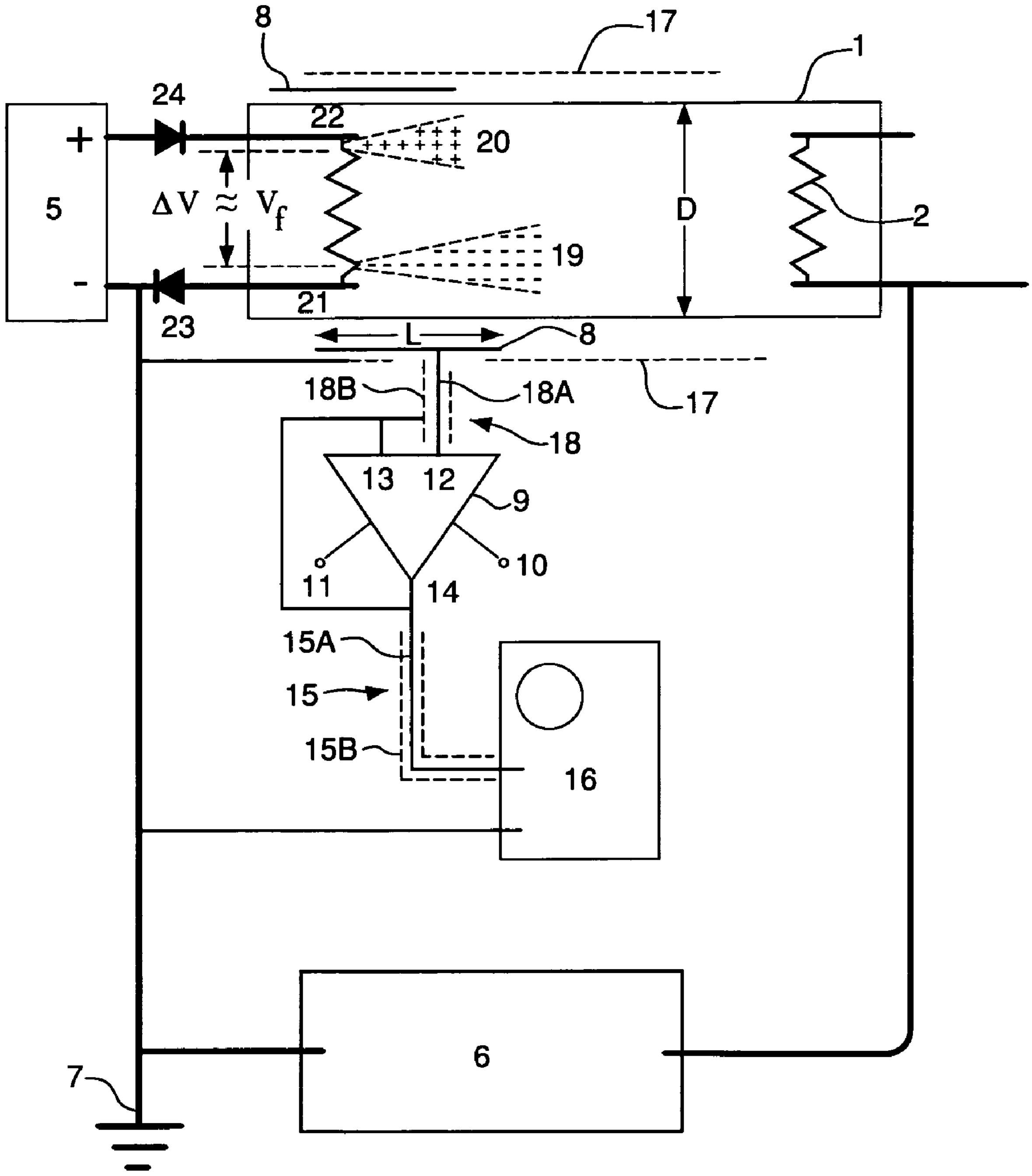
FIG. 5 is a block diagram of another example embodiment of apparatus according to the invention for measuring cathode fall.

This issue may be resolved by modifying the measuring circuit of FIG. 4, as shown in FIG. 5, to include a pair of diodes 23, 24 in the cathode heating circuit. The diodes 23, 24 may be polarized, as shown, in such a direction as to force the anode current to be collected at the positive lead 22 that electrically connects the DC power supply 5 to the electrode 3, and the cathode current to be emitted as close as possible to the negative lead 21 that electrically connects the DC power supply 5 to the electrode 3. In operation, an anode plasma 20 will form near the positive lead 22, and a cathode plasma 19 will form near the negative lead 21. The difference in potential between the points of emission 19 and collection 20 is now known, and is approximately equal to the value of the cathode heater voltage itself.

Figure 6:
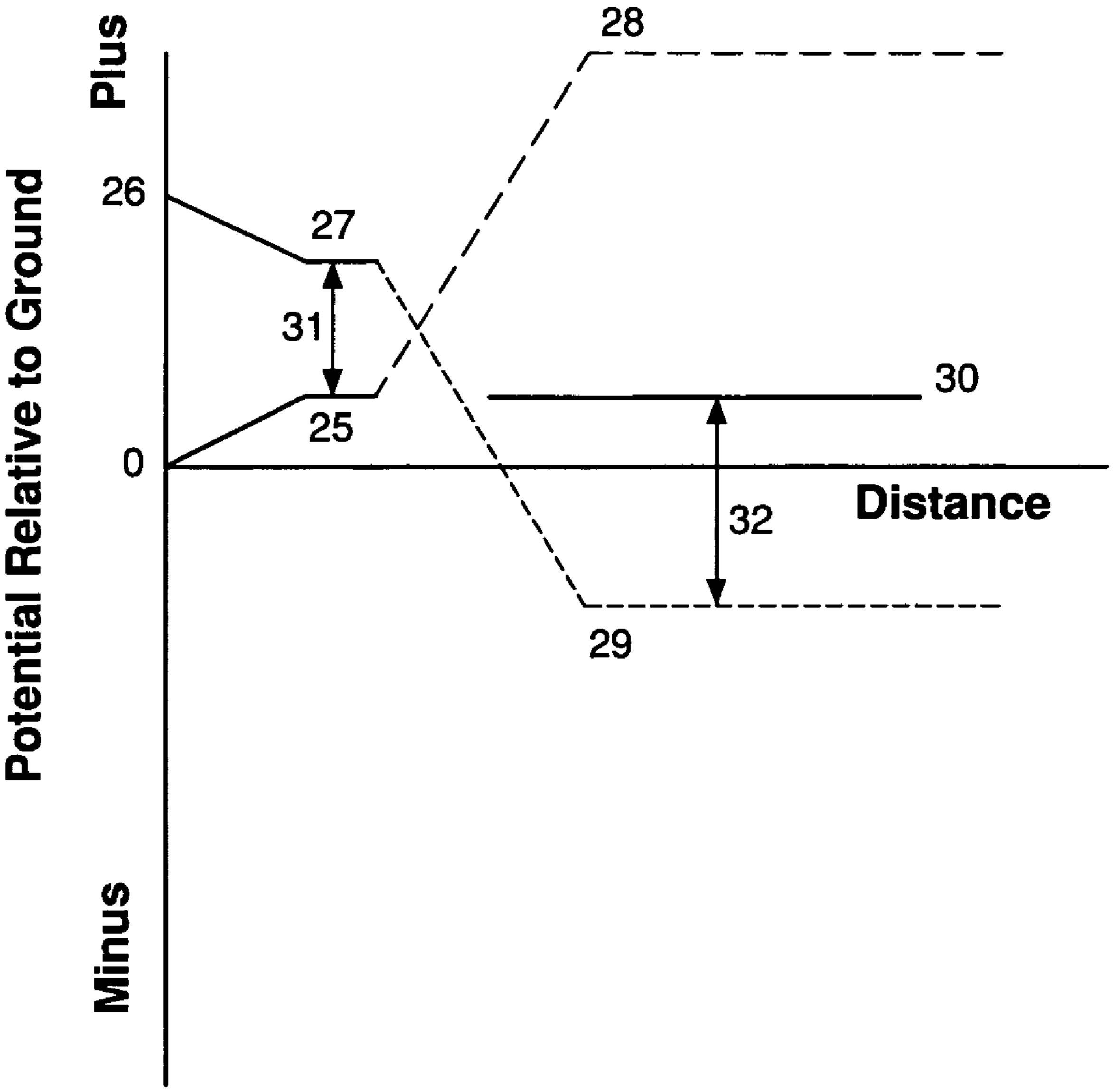
FIG. 6 is a diagram of plasma potentials on anode and cathode half cycles.

FIG. 6, which is a diagram of plasma potentials on anode and cathode half cycles, illustrates how this information may be used to establish the zero of potential for cathode fall measurement. Shown in FIG. 6 are potentials as a function of distance along the circuit and into the plasma 4 (i.e., as a distance away from the electrode 3). The potential 25 of lead 21 is positive with respect to ground by the potential drop across diode 23. Line 28 represents the potential in the negative glow on the cathode half cycle. The line connecting lines 25 and 28 represents the gradient of potential in the cathode sheath. The potential difference between lines 25 and 28 is, therefore, the cathode fall.

The gradients of potential between lines 25 and 28 and between lines 27 and 29 represent the potential gradients within the cathode and anode sheaths, across which appear the cathode and anode falls of potential respectively. These sheaths are very thin in comparison to the extents of the negative glow and anode glow plasmas whose potentials are being measured by capacitive pick-up. For clarity, the thicknesses of these sheaths are shown very much exaggerated relative to the plasma dimensions in FIG. 6.

Potential 26 is the positive output potential of the cathode-heating power supply 5. The potential 27 of lead 22 is negative with respect to the power supply output terminal by the potential drop across diode 24. The difference 31 in potential between lines 25 and 27 is, therefore, the DC heater voltage applied to the cathode 3. Line 29 represents the potential in the anode plasma 20, with anode fall being the difference in potential between the anode plasma 20 and the anode collection lead wire 22. Thus, the anode fall is the potential difference (31+32) between lines 29 and 27.

At the maximum of the anode fall cycle, the anode fall potential is −10.4 volts. Therefore, the potential difference 32, between the peak 29 of anode fall and the zero 25 of cathode fall, is equal to −10.4 volts plus $V_F$, where $V_F$ is the heater voltage.

To put the cathode half cycle waveform on an absolute potential scale, therefore, one may adjust the vertical position of the oscilloscope trace with reference to the zero of the grid to bring the peak of the anode fall oscillation to −10.4 volts plus the value of the heater voltage $V_F$. The zero of the grid thus becomes the zero from which to measure cathode fall as a function of time. Thus, the introduction of the diodes 23, 24 has virtually eliminated the uncertainty of potential difference between zero of anode fall and the zero of cathode fall by forcing this difference to be equal to the cathode heater voltage itself.

Results of test measurements made using a system as depicted in FIG. 5 will now be described in connection with FIGS. 7-15, which provide cathode and anode fall waveforms measured under various conditions. To maintain the mercury vapor pressure in the lamp-under-test at a predetermined value despite changes in the lamp's operating power, each lamp-under-test was operated in a controlled-temperature water bath. As the results show, cathode fall is dependent on mercury vapor pressure, as well as on other variables. Discharge current was furnished by a 60 Hz AC circuit with adjustable linear reactor ballasting impedance. DC cathode heating power was provided. It should be noted that the actual lamps employed for these experiments had been used extensively in prior testing and, consequently, their cathodes were in relatively poor condition. Therefore, the cathode falls measured and presented herein are likely higher than those that would have been obtained for lamps with normally-active cathodes.

Figure 1:
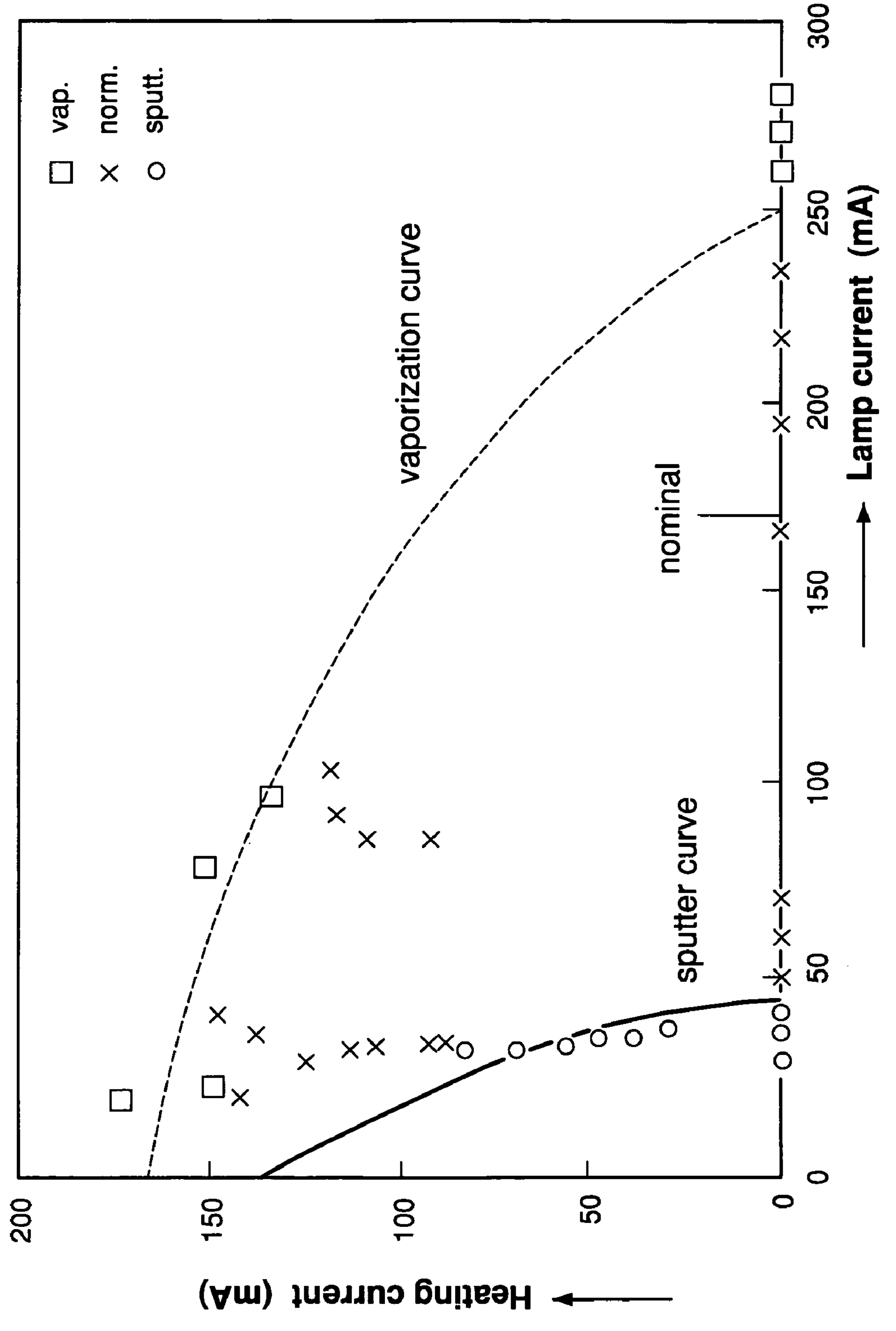
FIG. 1 (Prior Art)
FIG. 1 provides typical prior art sputter and vaporization curves.
Figure 2:
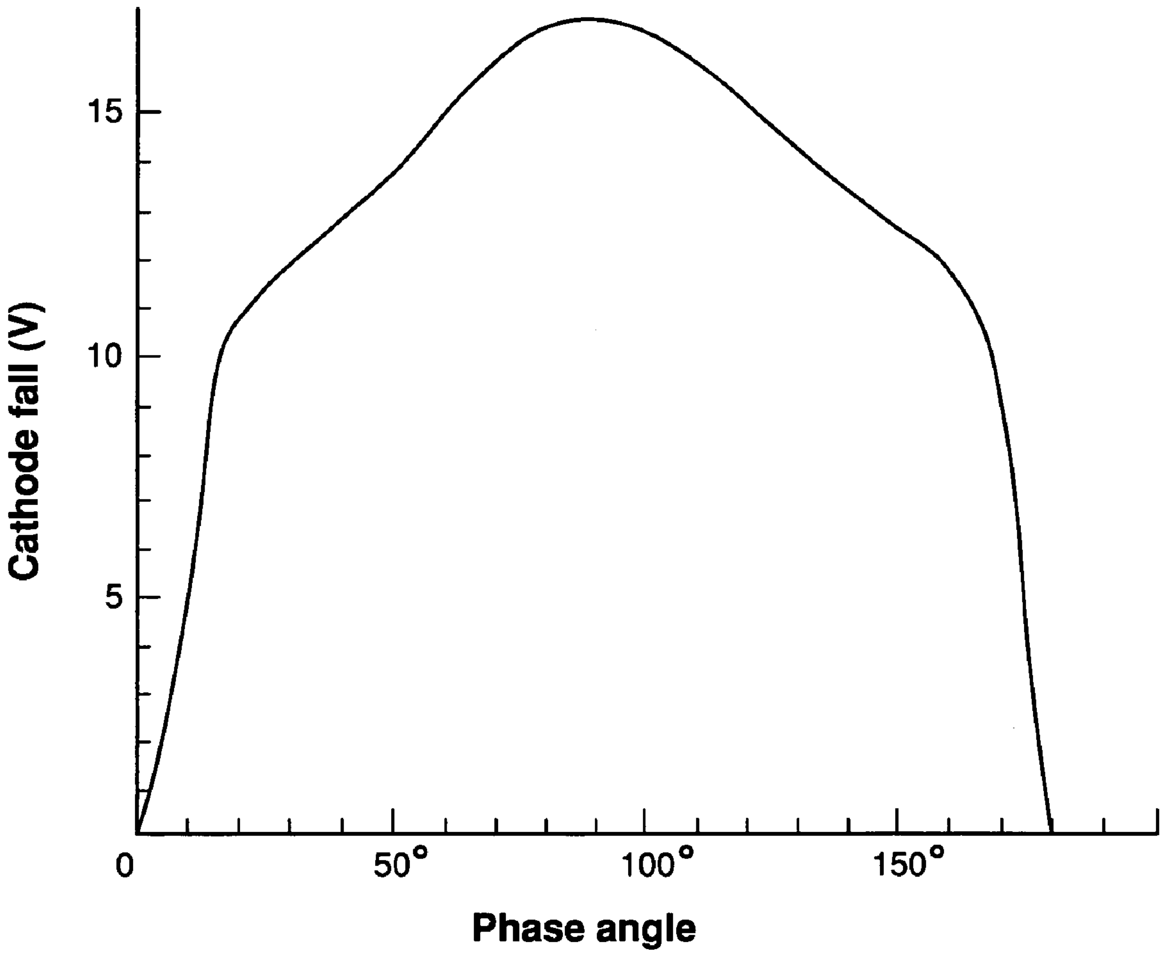
FIG. 2 (Prior Art)
FIG. 2 provides a prior art plot of cathode fall as a function of phase angle for a typical fluorescent lamp.
Figure 3A:
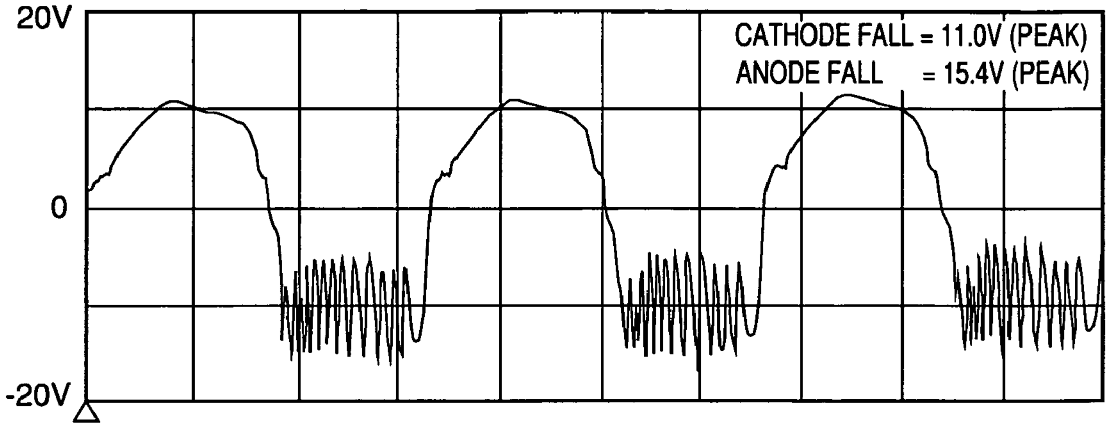
FIG. 3A (Prior Art)
FIG. 3A provides a prior art plot of cathode and anode falls for a typical fluorescent lamp.
Figure 3B:
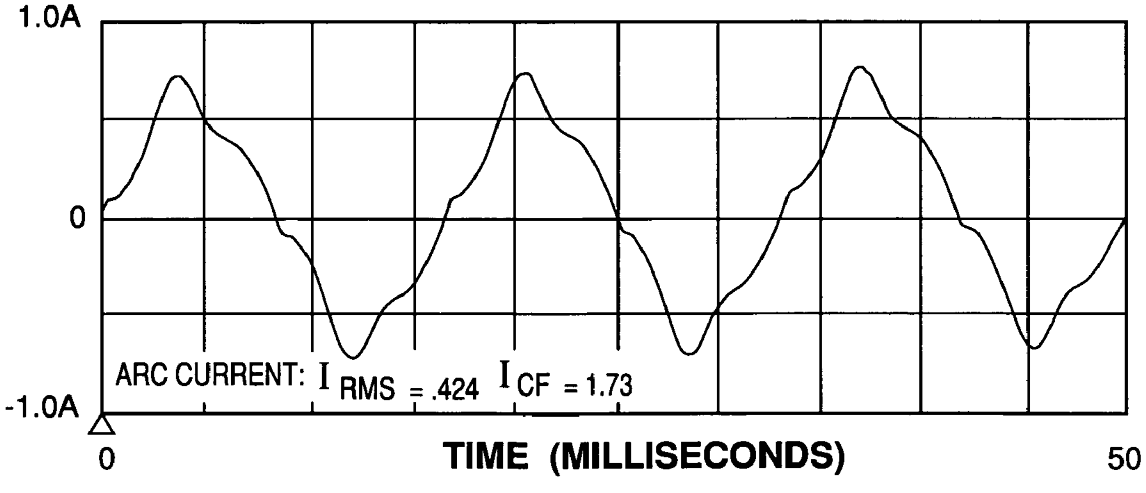
FIG. 3B (Prior Art)
FIG. 3B provides a prior art plot of arc current supplied to produce the cathode and anode falls plotted in FIG. 3A.

It may be gleaned from the data provided in FIGS. 7-15 that cathode fall rises rapidly early in the cathode half cycle, until it reaches a level of about 10-12 v, at which its rate of increase abruptly slows, forming a "shoulder" in the waveform. This is consistent with the fact that for cathode falls of less than 10.4 volts, the only ionization process possible is two-stage ionization of mercury, which is known to be an inefficient process. Above 10.4 volts, direct ionization of mercury is energetically possible. Above 11.5 volts, formation of argon metastable atoms occurs, with resultant Penning ionization of mercury. Thus, the increasing demand of the cathode for ion current requires a rapidly increasing cathode fall, until the onset of the more efficient direct and Penning processes, following which the rate of increase becomes much lower. These same effects may be seen at approximately the same cathode fall in the waveforms provided in FIGS. 2 and 3.

Figure 7:
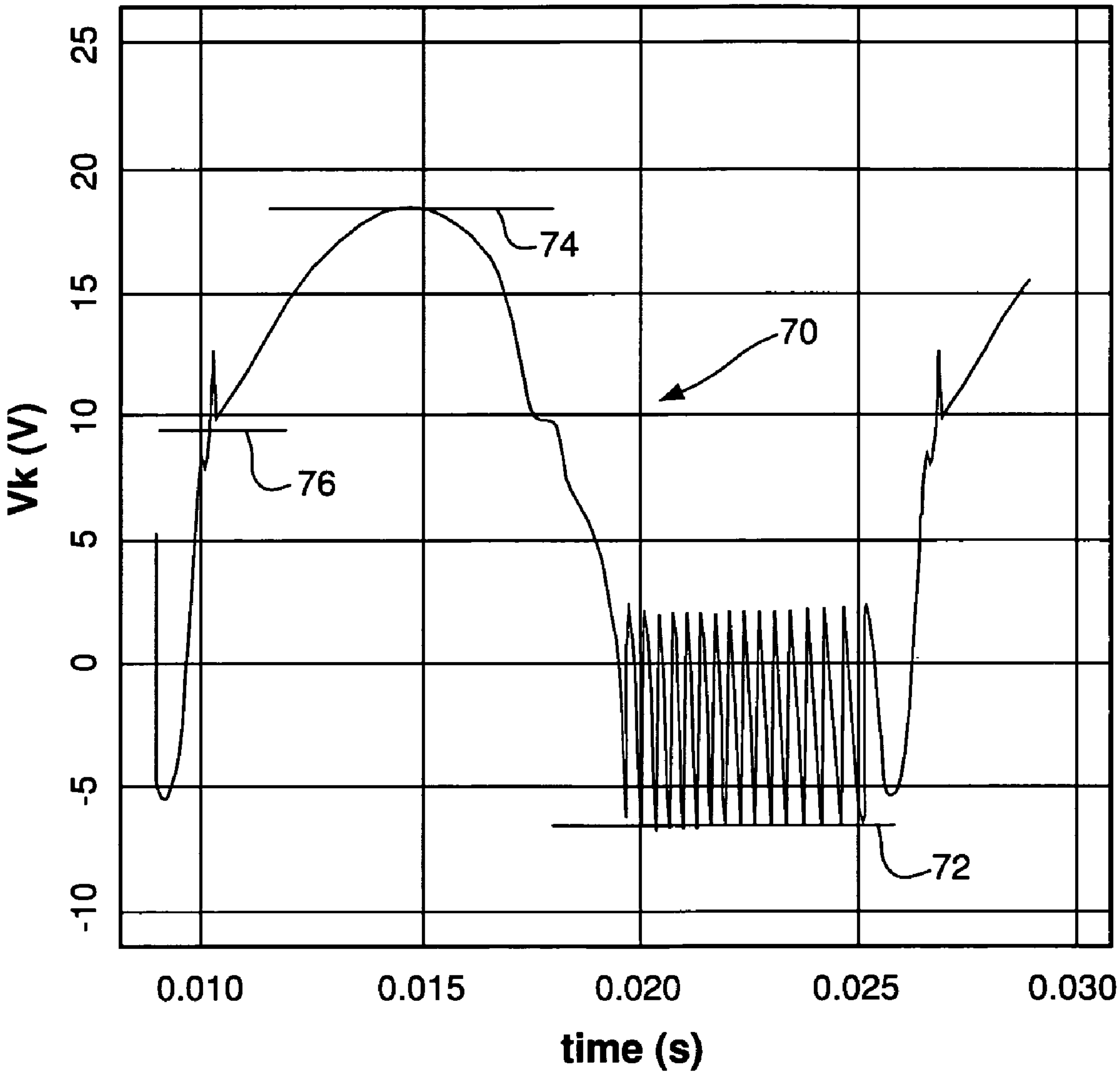
FIGS. 7-14 provide cathode and anode fall waveforms measured under various conditions in accordance with the invention.

FIG. 7 provides a cathode and anode fall waveform 70 for a T12 lamp at a discharge current of 360 ma, a cathode heater voltage of 3.8 v, and a condensed-mercury temperature of 39.8° C. As shown, the anode fall peaks 72 are set at about −10.4+3.8=−6.6 v. The cathode fall peak 74 is about 18.3 v. The cathode fall shoulder 76 is at about 9.5 v.

Figure 8:
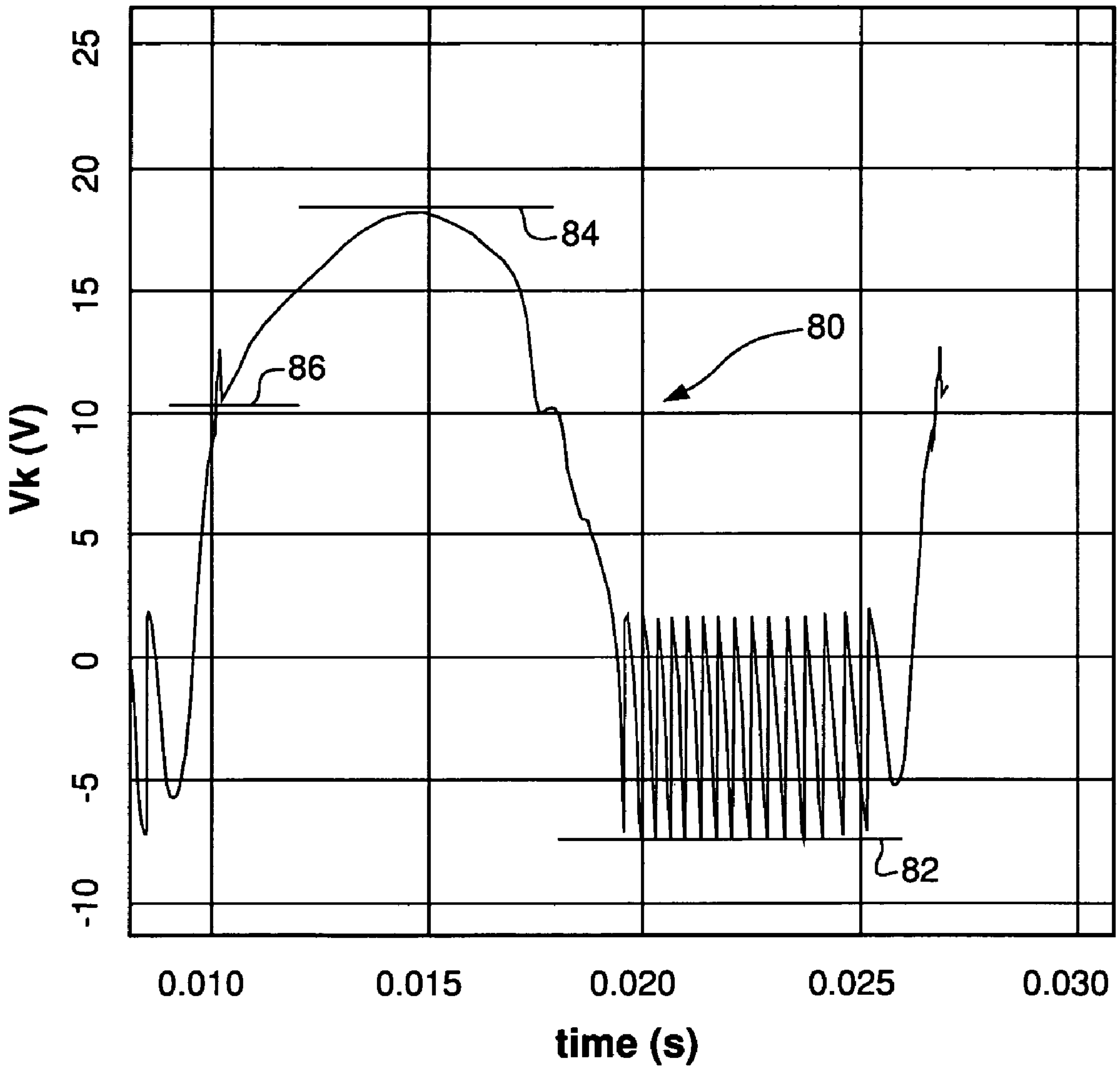

FIG. 8 provides a cathode and anode fall waveform 80 for a T12 lamp at a discharge current of 250 ma, a cathode heater voltage of 2.9 v, and a condensed-mercury temperature of 24.1° C. As shown, the anode fall peaks 82 are set at about −10.4+2.9=−7.5 v. The cathode fall peak 84 is about 18.3 v. The cathode fall shoulder 86 is at about 10.3 volts. Thus, this example shows that a cathode heater voltage of 2.9 v maintains the cathode fall for reduced discharge current and mercury vapor pressure at the same value as under standard operating conditions.

Figure 9:
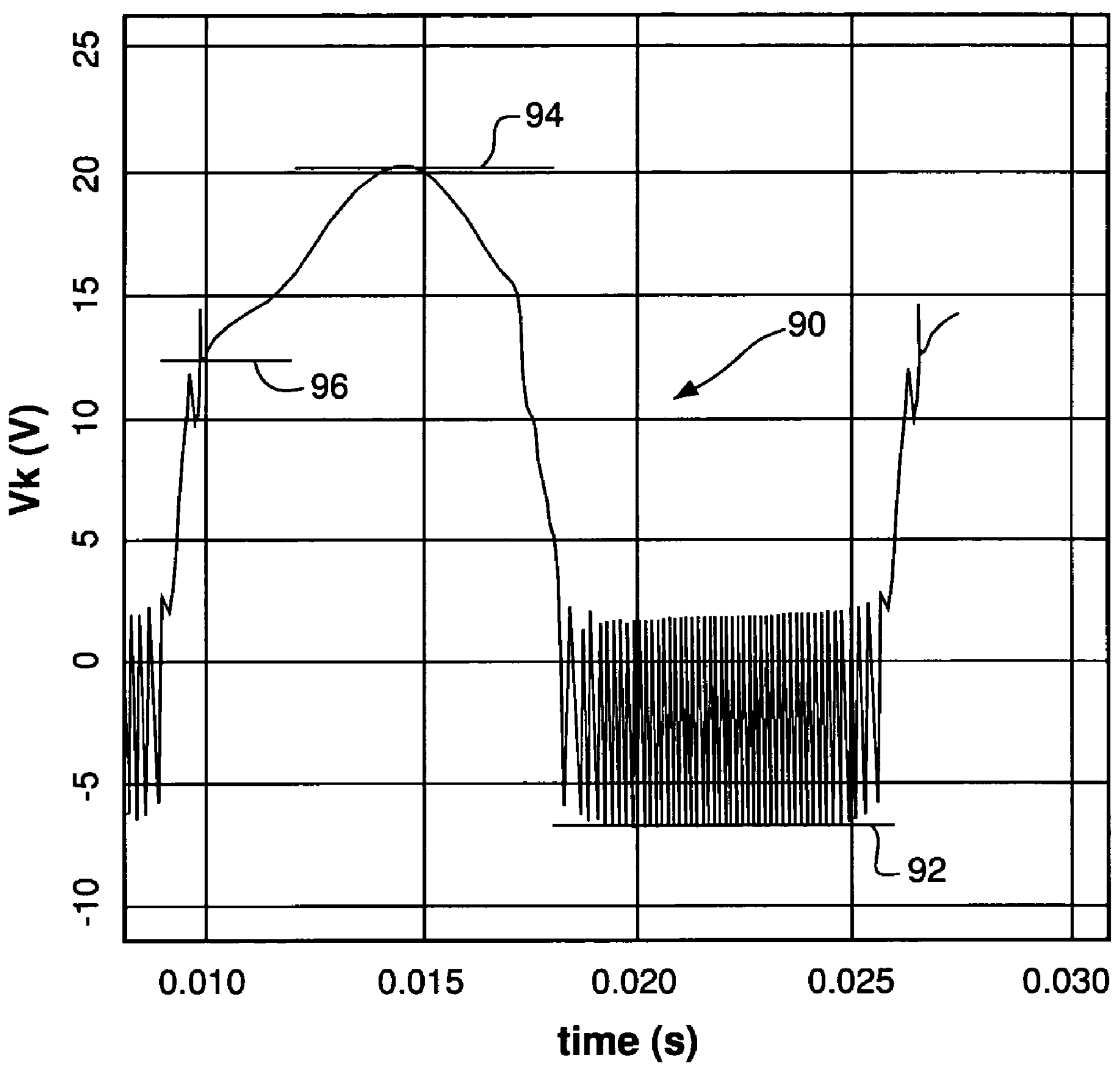

FIG. 9 provides a cathode and anode fall waveform 90 for a T8 lamp at a discharge current of 270 ma, a cathode heater voltage of 3.7 v, and a condensed-mercury temperature of 40.4° C. As shown, the anode fall peaks 92 are set at about −10.4+3.7=−6.7 v. The cathode fall peak 94 is about 20.1 v. The cathode fall shoulder 96 is at about 12.4 volts.

Figure 10:
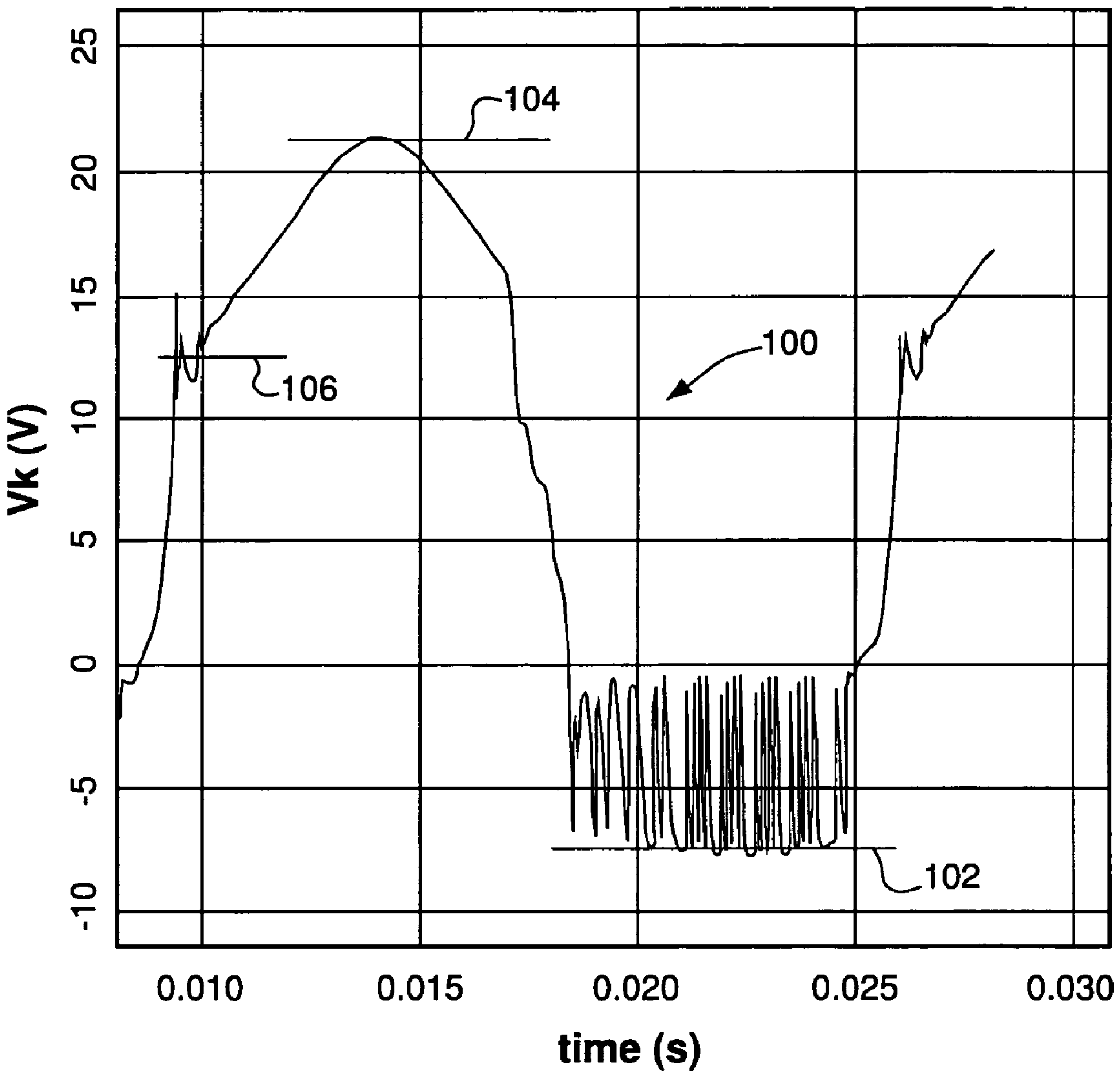

FIG. 10 provides a cathode and anode fall waveform 100 for a T8 lamp at a discharge current of 70 ma, a cathode heater voltage of 2.9 v, and a condensed-mercury temperature of 40.4° C. As shown, the anode fall peaks 102 are set at about −10.4+2.9=−7.5 v. The cathode fall peak 104 is about 21.2 v. The cathode fall shoulder 106 is at about 12.4 volts.

Figure 11:
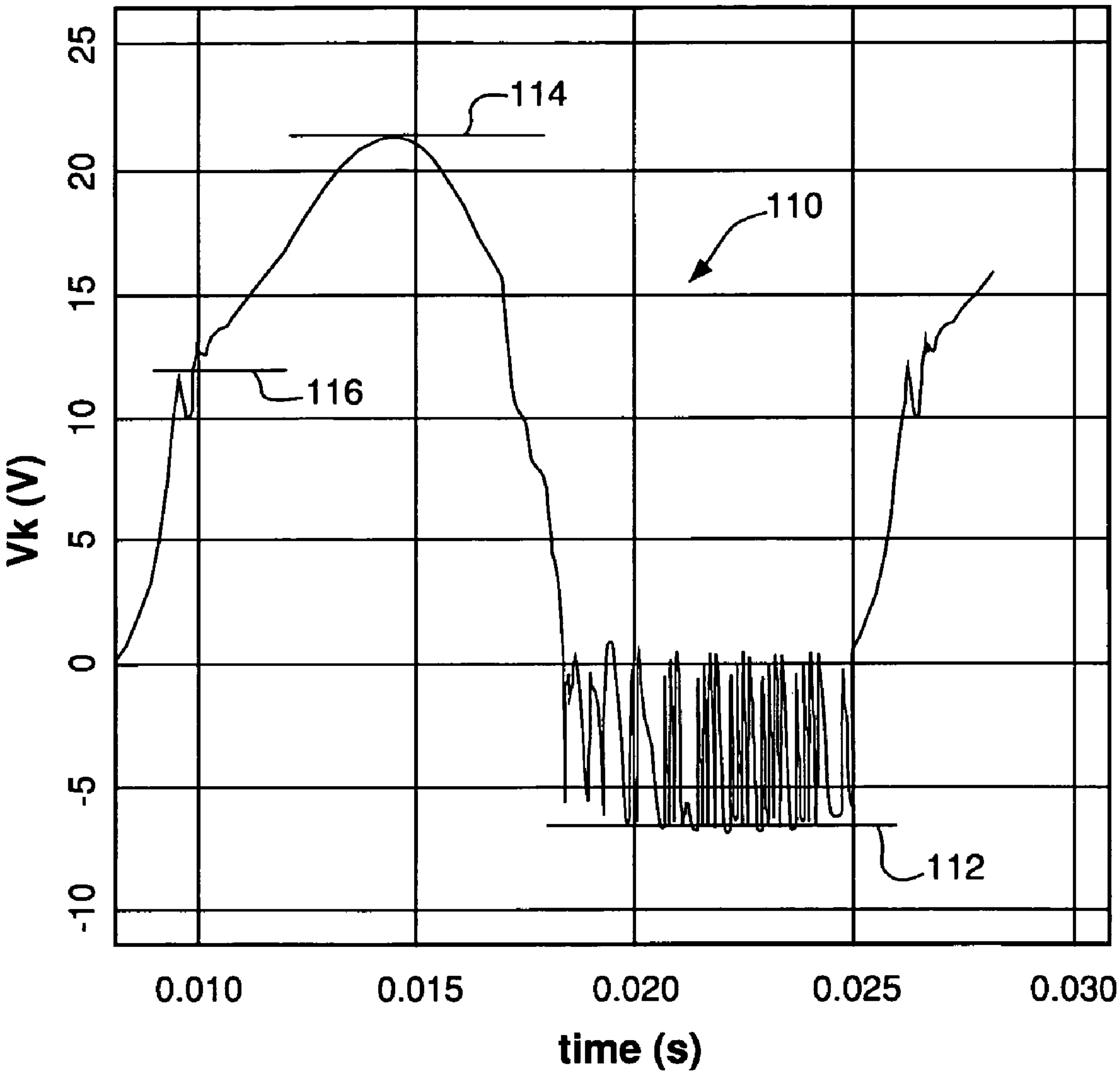

FIG. 11 provides a cathode and anode fall waveform 110 for a T8 lamp at a discharge current of 70 ma, a cathode heater voltage of 3.8 v, and a condensed-mercury temperature of 40.4° C. As shown, the anode fall peaks 112 are set at about −10.4+3.8=−6.6 v. The cathode fall peak 114 is about 21.3 v. The cathode fall shoulder 116 is at about 11.9 v.

Figure 12:
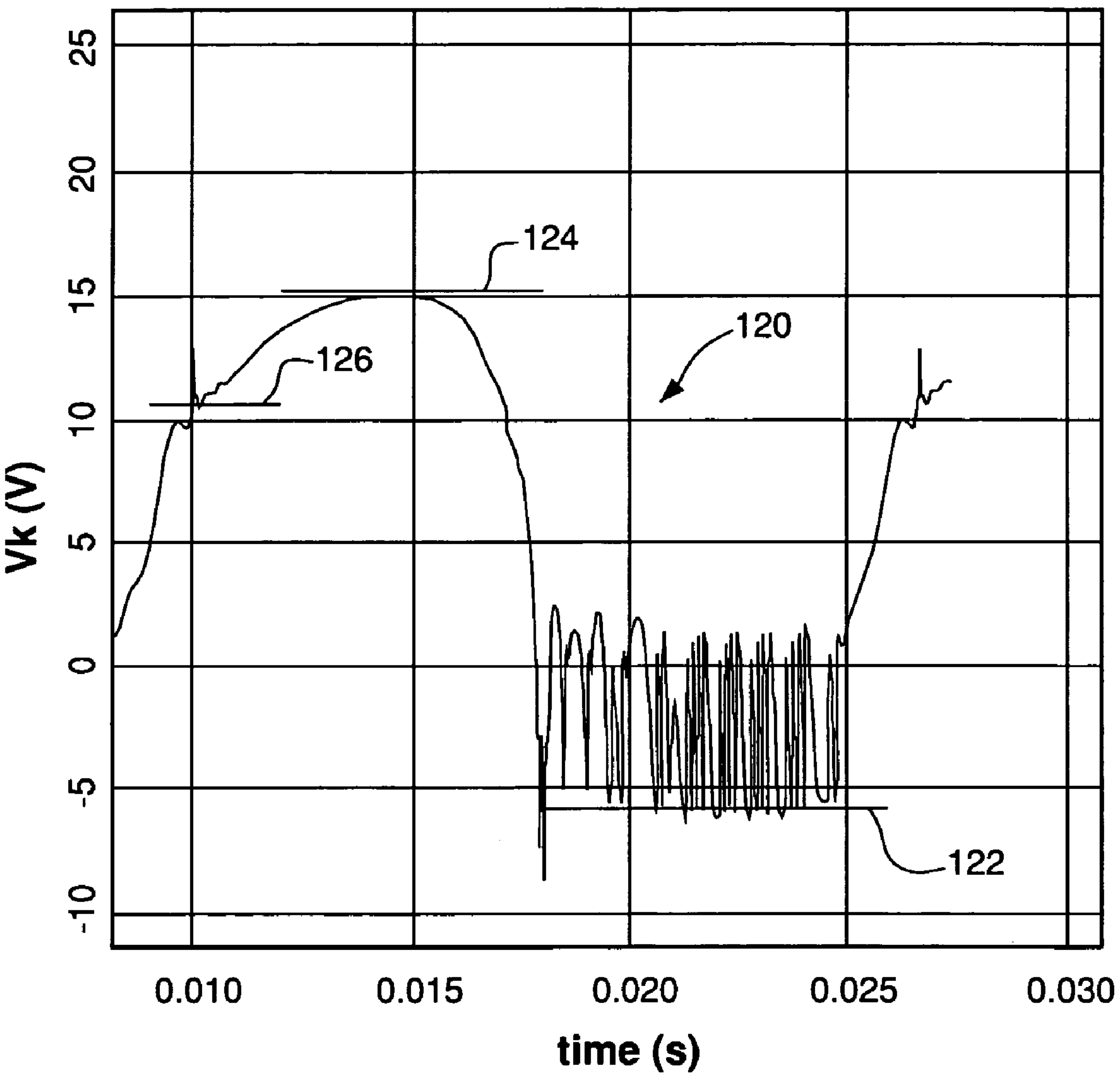

FIG. 12 provides a cathode and anode fall waveform 120 for a T8 lamp at a discharge current of 69 ma, a cathode heater voltage of 4.6 v, and a condensed-mercury temperature of 39.8° C. As shown, the anode fall peaks 122 are set at about −10.4+4.6=−5.8 v. The cathode fall peak 124 is about 15.1 v. The cathode fall shoulder 126 is at about 10.6 v.

Figure 13:
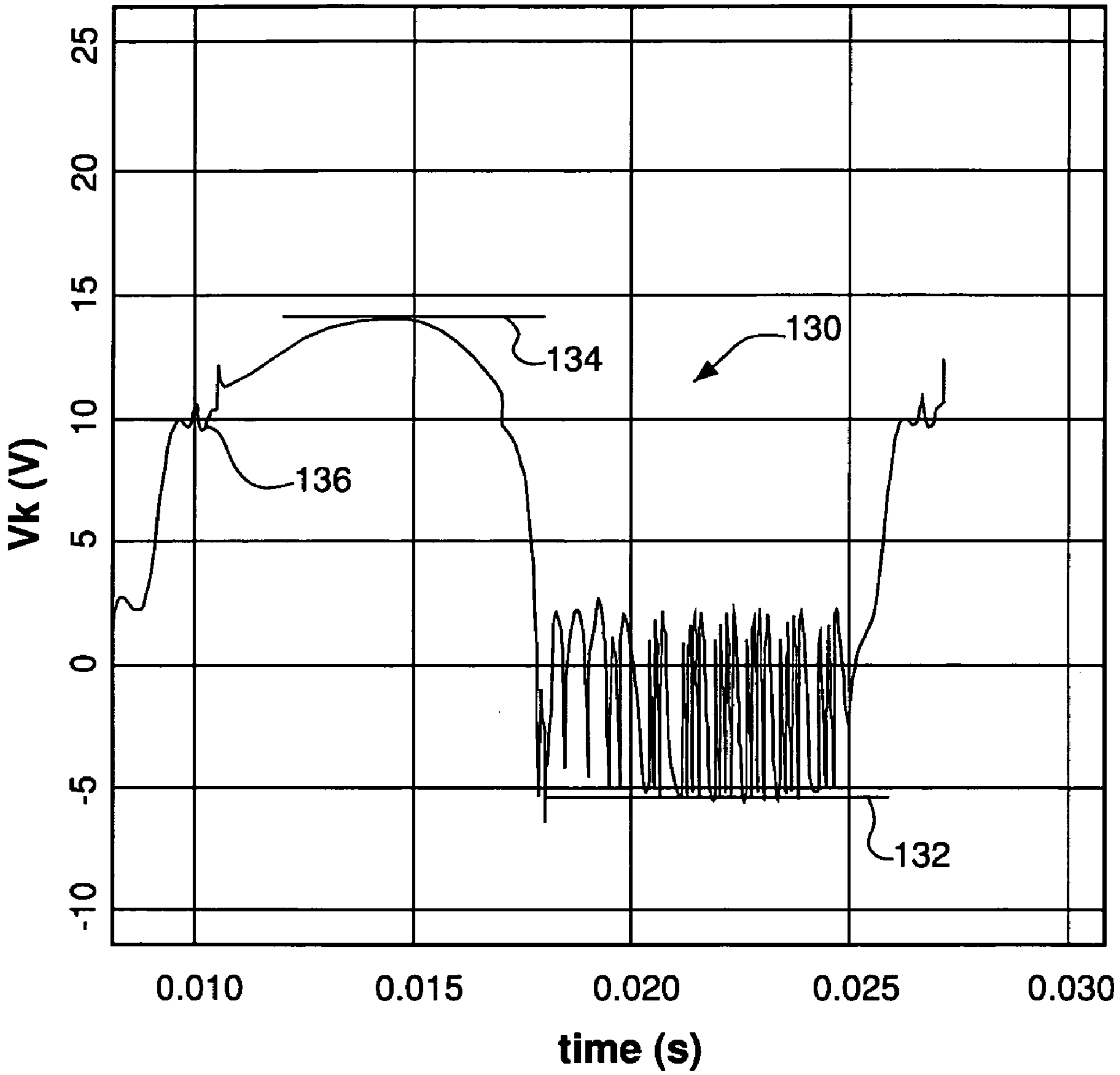

FIG. 13 provides a cathode and anode fall waveform 130 for a T8 lamp at a discharge current of 65 ma, a cathode heater voltage of 5.0 v, and a condensed-mercury temperature of 39.8° C. As shown, the anode fall peaks 132 are set at about −10.4+5.0=−5.4 v. The cathode fall peak 134 is about 14.0 v. The cathode fall shoulder 136 is at about 10.0 v.

Figure 14:
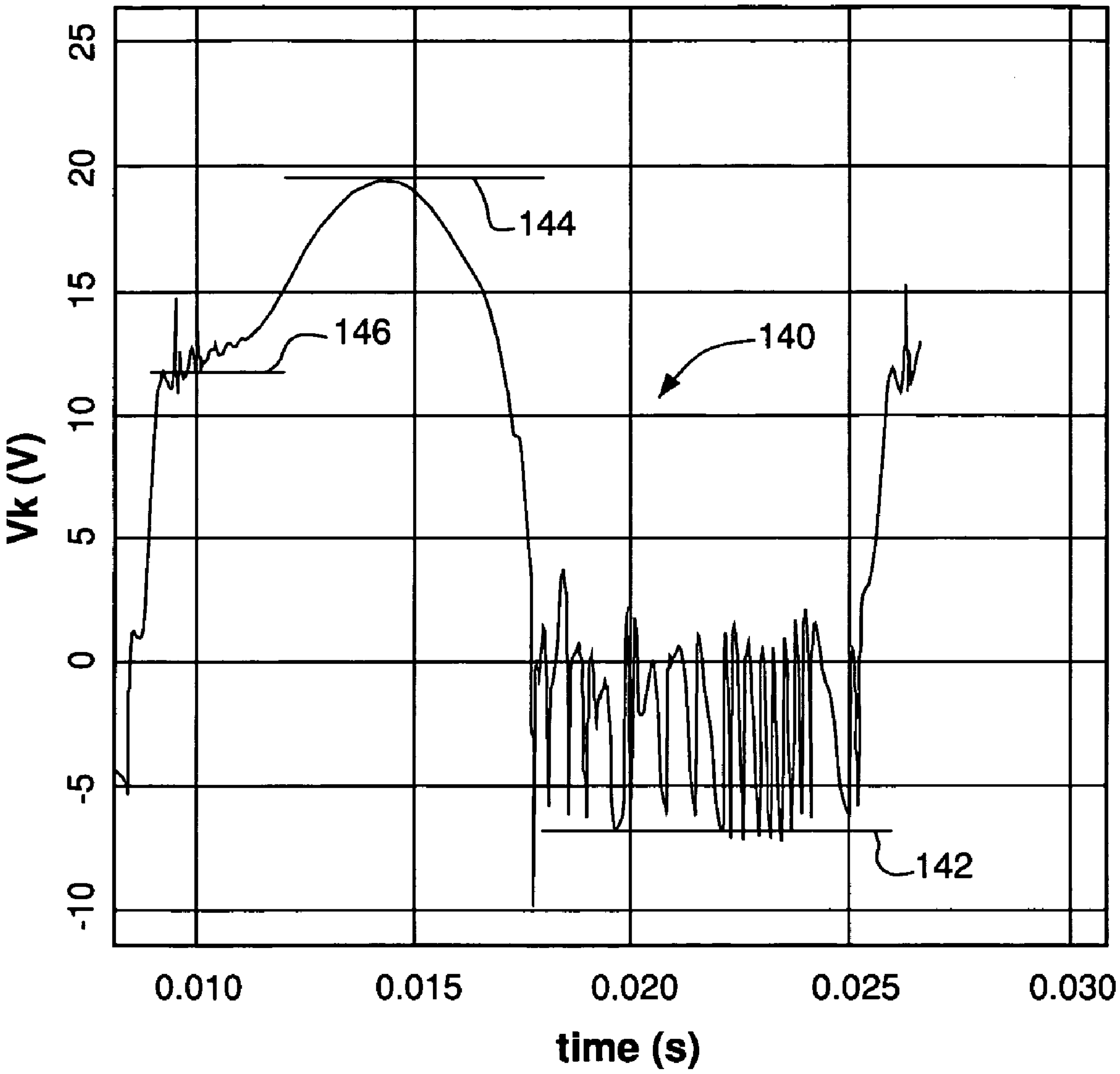

FIG. 14 provides a cathode and anode fall waveform 140 for a T8 lamp at a discharge current of 65 ma, a cathode heater voltage of 3.7 v, and a condensed-mercury temperature of 19.7° C. As shown, the anode fall peaks 142 are set at about −10.4+3.7=−6.7 v. The cathode fall peak 144 is about 19.5 v. The cathode fall shoulder 146 is at about 11.7 v.

Figure 15A:
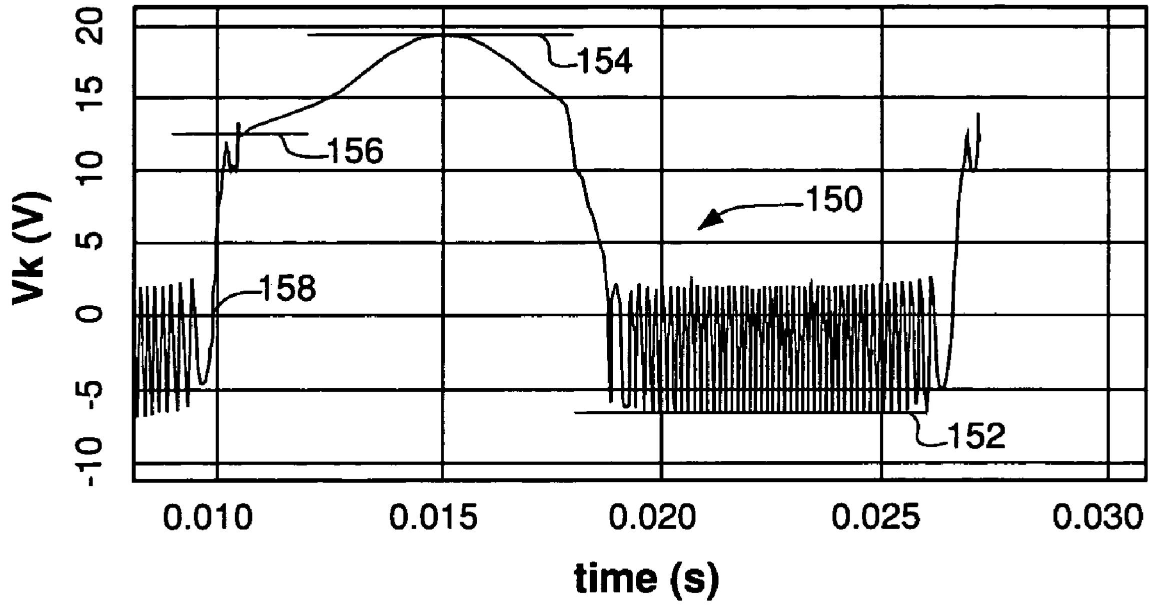
FIG. 15A provides a cathode and anode fall waveform measured in accordance with the invention.

FIG. 15A provides a cathode and anode fall waveform 150 for a T8 lamp at a discharge current of 270 ma, a cathode heater voltage of 3.7 v, and a condensed-mercury temperature of 40.1° C. As shown, the anode fall peaks 152 are set at about −10.4+3.7=−6.7 v. The cathode fall peak 154 is about 19.4 v. The cathode fall shoulder 156 is at about 12.8 v.

Figure 15B:
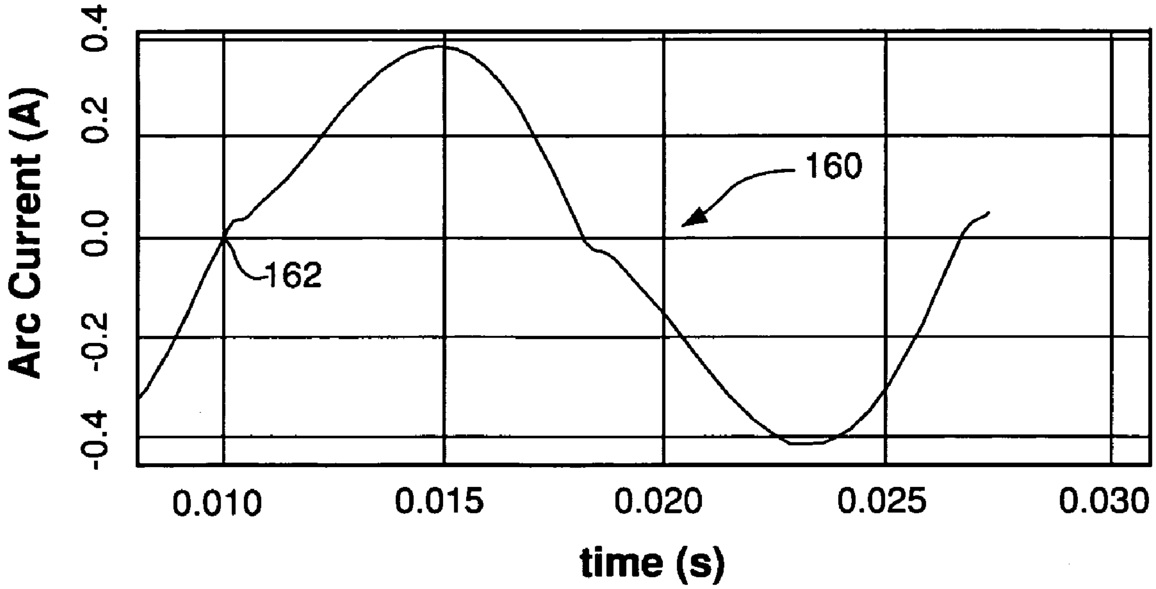
FIG. 15B provides a waveform of lamp current supplied to produce the cathode and anode fall waveform shown in FIG. 15A.

Shown in FIG. 15B is a waveform 160 of discharge current to illustrate that zero of cathode fall 158 does not occur at zero-current crossing 162. At the leading zero of discharge current, the cathode fall is already about 9.9 v. At the trailing zero, the cathode fall is approximately 10 v.

Table I presents peak cathode fall versus cathode heater voltage for T8 lamps at several discharge currents and condensed mercury temperatures. Nominal values are used in the table for discharge currents and condensed mercury temperatures.

TABLE I

| | Cathode Heater Voltage | | | |
|---|---|---|---|---|
| Discharge Current/Cond Hg Temp | 2.9 | 3.7-3.8 | 4.6 | 5.0 |
| 270 ma/40 C. | | 20.1 | | |
| 70 ma/40 C. | 21.2 | 21.3 | 15.1 | 14.0 |
| 70 ma/20 C. | | 19.5 | | |

The foregoing data indicate that, at a discharge current of 70 ma, a cathode heater voltage that is greater than the rated 3.75 v is required to generate a cathode fall that is roughly the same as the cathode fall generated at the rated discharge current (i.e., 270 ma) and cathode heater voltage (i.e., 3.75 v). That is, as the cathode fall at 70 ma, 3.8 v is 21.3v, and the cathode fall at 270 ma, 3.7 v is 20.1 v (i.e., 1.2 v less), heater voltage must clearly be higher at 70 ma than at 270 ma for equal cathode fall. From the cathode fall of 15.1 v at 70 ma, 4.6 v, one may conclude that a heater voltage of about 4.0-4.1 v would be required for cathode fall of 20.1 v at 70 ma.

The maximum useful frequency of discharge current for employing this method and technique of cathode fall measurement is the reciprocal of the deionization time, since above this frequency, the anode oscillations used for establishing the zero of potential disappear. The deionization time, $T_d$, is the time required for the ions and electrons of the negative glow plasma to diffuse to the wall of the tube and recombine. $T_d=(1/D)(R/2.4)^2$, where D is diffusion coefficient and R is tube radius. When the period of the AC operating current is shorter than this time, the high density negative glow plasma does not dissipate between half cycles, but is still present during the anode half cycle. The collection of the anode current from this high-density plasma does not require an anode fall greater than 10.4 volts, and the anode oscillation phenomenon disappears. Provided, however, that high frequency discharge current waveforms do not call for peak currents higher than the 60-hz waveforms, the heater voltage or current profiles determined at low frequency may still be used.

Thus, there have been described apparatus and methods for making capacitive measurements of cathode fall in linear fluorescent lamps that employ anode fall peak for determination of a zero-voltage reference, thereby placing the waveforms of cathode and anode fall on an absolute rather than relative basis.

Using the principles of the invention, a ballast designer, for example, may now identify a range of cathode-heater voltages that may be supplied to the electrodes of a certain lamp (or lamp type) so that cathode fall does not exceed a level that would cause the lamp to fail even over a range of discharge currents. For example, one could determine a range of cathode-heater voltages that would prevent the peak cathode fall from exceeding the excitation threshold of the rare-gas filling, e.g., ~13 v for argon. A respective range of cathode-heater voltages may then be determined for each of a number of lamp types. A dimming ballast may then be designed to cause the cathode-heater power supply to supply a cathode-heater voltage that would be within range for multiple lamp types.

It should be understood that this technique may be employed using any $V_{fil}$ waveform (e.g., sine, square, etc.). For example, though the techniques for measuring cathode fall described above use only DC heater voltages, in application in dimming ballasts, any heater voltage or current waveform having the same rms value of heating power as a previously measured DC case may be used.

Further, it should be understood that this technique may be employed on a representative population of lamps or lamp types. Using the information gathered about cathode-heater voltage as a function of discharge current for each of several lamps or lamp types, a ballast may be designed that that causes the cathode-heater power supply to apply a cathode-heater voltage, as a function of discharge current, according to a trajectory that would work for each of the several lamps or lamp types. Thus, a single ballast type could be designed to work with a number of lamp types.

Using the principles of the invention, a ballast designer could optimize a ballast design for steady-state operation (as described above), as well as for rapid-start applications. For rapid-start applications, a typical ballast designer seeks to determine whether a given preheat profile is acceptable. The issue is typically one of identifying a preheat profile that results in the quickest relaxation to their steady-state, or "running," values.

Similarly, a ballast designer could design a ballast that causes the cathode-heater power supply to dynamically provide a heater current (or voltage) that prevents the cathode fall from exceeding the threshold level. Thus, a "smart" dimming ballast could be designed that dynamically controls cathode-heater current based on the discharge current at a given time.

Such a smart dimming ballast could include a microprocessor having an input that is electrically coupled to the output of the operational amplifier. The potential signal output from the operational amplifier could thus be received by the microprocessor. The microprocessor could be programmed to determine anode fall peak over a single half-cycle, or an average anode fall peak over a plurality of cycles, of the AC waveform. With knowledge of the anode fall peak and the heater voltage, the microprocessor could then determine the cathode fall for the current discharge current. If the cathode fall peak exceeds a preprogrammed threshold (which could be set such that the cathode fall does not exceed 13.4 v, for example), the microprocessor could cause the heater power supply to increase the current flow to the electrodes.

A further advantage of the invention, from a lamp manufacturer's point of view, for example, is that of shortening the time required to design a cathode for a new lamp type. Currently, test cathodes must be fabricated, lamps made and life tested for extended periods of time to determine whether life performance is within specified limits. If not, one or more subsequent iterations of alternate designs must be carried out. By using a technique according to the invention, lamp/filament designs could be vetted for cathode fall without life testing. Thus, final designs having a desired cathode fall, cathode temperature, and coating weight may be arrived at much more quickly.

Similarly, a lamp designer could characterize a lamp type or filament type, without the need for life testing, by employing the principles of the invention. For example, a lamp designer could test a certain filament type to determine how it behaves under certain conditions. That is, the lamp designer could measure lamp performance data according to the invention for various filaments at various values of heater voltage, condensed mercury temperature, discharge current, etc. Such lamp performance data may then be published in connection with the lamp, such as by publication in a specification associated with the lamp (e.g., for warranty purposes).

Additionally, a lamp manufacturer may benefit from the shortening of the time required to design a cathode for a new lamp type. Currently, test cathodes must be fabricated, and lamps made and life tested for extended periods of time to determine whether life performance is within specified limits. If not, a second iteration, sometimes even a third, of alternate designs must be carried out. With the inventive technique, designs could be vetted for cathode fall without life testing, and final designs having the desired cathode fall, cathode temperature, and coating weight arrived at much more quickly; only the refined design need be life tested for confirmation.

The principles of the invention could also be applied to "audit" a lamp type for changes, such as filament changes. Lamp manufacturers do not always inform ballast designers of changes made to the designs of the lamps. The ballast designers who design a particular ballast for a particular lamp type may find that the ballast no longer works as effectively as possible because the lamp type has been changed. By occasionally testing the lamp type using apparatus and methods of the invention, a ballast designer can determine whether the functionality of a particular ballast should be modified because a lamp type has been changed.

As described above, cathode fall may be measured in linear fluorescent lamps operated on 60-Hz AC. Such techniques provide an absolute reference point for the measurement of cathode fall in that they enable a determination of the peak value of anode fall. At higher frequencies of operation, however, such as 20-25 kHz, which is common in many electronic dimming ballast applications, anode fall is unavailable to provide such a reference point. However, if the magnitude of a single point on the cathode fall waveform can be identified, the cathode fall waveform may still be determined using the techniques described above. For example, one or more of the prior art methods described above for measuring cathode fall may be employed to identify the magnitude of at least one point on the cathode fall waveform. Alternatively, a spectroscopic method for measuring cathode fall, such as that disclosed and claimed in U.S. Pat. No. 7,116,055, may be used to identify the magnitude of at least one point on the cathode fall waveform. With knowledge of the magnitude of cathode fall at one point, which can be used as a reference point, the cathode fall waveform can be determined using the capacitive techniques described above. Thus, the cathode-heating-profile obtained for 60 Hz AC, for example, may then be used as a guide in the design of electronic dimming ballasts operating at higher AC frequencies.

Modifications and variations in the apparatus and methods of the invention will be readily apparent to those of ordinary skill in the art. We therefore intend for our invention to be limited only by the scope of the appended claims.

What is claimed:

1. A method for making capacitive measurements of cathode fall potential in a fluorescent lamp, the fluorescent lamp containing an electrode, the method comprising:

determining a magnitude of a plasma potential associated with the electrode at a reference point;

measuring a cathode fall potential waveform associated with the electrode; and determining a respective magnitude of each of a plurality of points along the cathode fall potential waveform based on the magnitude of the plasma potential at the reference point, wherein measuring the cathode fall potential waveform comprises measuring the cathode fall potential waveform using a capacitive measurement apparatus comprising an electrically conductive sleeve that surrounds a portion of the lamp that contains the electrode, and an operational amplifier having an output terminal and first and second input terminals, wherein the first input terminal is electrically coupled via a shielded cable to the conductive sleeve, the shielded cable comprising an electrical shield, and wherein the output terminal is electrically coupled to the second input terminal of the operational amplifier and to the electrical shield.

2. The method according to claim 1, wherein the plasma potential associated with the electrode at the reference point is representative of an anode fall potential associated with the electrode.

3. The method according to claim 2, wherein the reference point is associated with a peak of the anode fall potential.

4. The method according to claim 3, wherein the peak of the anode fall potential is −10.4 volts.

5. The method according to claim 1, wherein determining the magnitude of the plasma potential at the reference point comprises measuring the plasma potential using a Langmir probe.

6. The method according to claim 1, wherein the lamp is operated at 60 Hz.

7. The method according to claim 1, wherein the lamp is operated at 20-25 kHz.

8. The method according to claim 1, wherein the plasma potential associated with the electrode at the reference point is representative of a cathode fall potential associated with the electrode.

9. The method according to claim 8, wherein determining the magnitude of the plasma potential at the reference point comprises measuring the cathode fall potential at the reference point by detecting radiation emitted from a gas contained within the fluorescent lamp and identifying the cathode fall potential associated with the electrode based on an intensity and wavelength of the detected radiation.

10. The method according to claim 1, wherein the operational amplifier provides an electrical signal that represents a potential of the sleeve.

11. The method according to claim 1, wherein the capacitive measurement apparatus further comprises an oscilloscope that is electrically coupled to the output terminal of the operational amplifier.

12. The method according to claim 1, wherein the capacitive measurement apparatus further comprises a signal processor that determines the respective magnitude of each of a plurality of points along the cathode fall waveform based on the magnitude of cathode fall at the reference point.

13. The method according to claim 1, wherein the measured cathode fall potential waveform represents a cathode fall potential plus an offset voltage.

14. The method according to claim 13, wherein the capacitive measurement apparatus further comprises an oscilloscope that is electrically coupled to the output terminal of the operational amplifier, and wherein determining the respective magnitudes of each of the plurality of points along the cathode fall potential waveform comprises adjusting the oscilloscope to zero-out the offset voltage.

15. The method according to claim 1, further comprising:

determining a magnitude of the plasma potential associated with the electrode at a second reference point, wherein determining the respective magnitudes of each of the plurality of points along the cathode fall potential waveform is based on the respective magnitudes of the plasma potential at the reference points.

* * * * *